(12) United States Patent
Lin et al.

(10) Patent No.: US 7,724,165 B2
(45) Date of Patent: May 25, 2010

(54) AUDIO CODEC AND BUILT-IN SELF TEST METHOD FOR THE SAME

(75) Inventors: Che-Min Lin, Taipei (TW); Chiao-Min Chen, Kaohsiung (TW); Kuo-Hsiung Wu, Taipei County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 173 days.

(21) Appl. No.: 12/175,220

(22) Filed: Jul. 17, 2008

(65) Prior Publication Data

US 2010/0017691 A1 Jan. 21, 2010

(51) Int. Cl.
*H03M 1/10* (2006.01)
(52) U.S. Cl. .................... 341/120; 341/144; 341/117; 341/118; 341/119; 341/155
(58) Field of Classification Search ......... 341/117–120, 341/144, 155
See application file for complete search history.

(56) References Cited

U.S. PATENT DOCUMENTS

| 5,621,800 | A * | 4/1997 | Weng et al. ................. 380/266 |
| 6,384,756 | B1 * | 5/2002 | Tajiri et al. .................. 341/120 |
| 6,473,731 | B2 * | 10/2002 | Hinderks ................. 704/200.1 |
| 6,854,003 | B2 * | 2/2005 | Jennings, III ............... 708/523 |
| 2006/0056641 | A1 * | 3/2006 | Nadjar et al. ................. 381/67 |

* cited by examiner

*Primary Examiner*—Jean B Jeanglaude
(74) *Attorney, Agent, or Firm*—Winston Hsu (57) ABSTRACT

An audio codec and a BIST method adapted for the audio codec are provided. The BIST method includes the following steps. A first channel digital-to-analog converter (DAC) of the audio codec converts a test signal into an analog signal. A first channel analog-to-digital converter (ADC) of the audio codec converts the analog signal into a digital signal. Use a second channel DAC of the audio codec and a second channel ADC of the audio codec to calculate the magnitudes of a plurality of spectral components of the DFT of the digital signal. Determine whether the audio codec passes the test according to the magnitudes of the spectral components.

20 Claims, 5 Drawing Sheets

AUDIO CODEC AND BUILT-IN SELF TEST METHOD FOR THE SAME

BACKGROUND OF THE INVENTION

1. Field of the Invention

The present invention generally relates to an audio code, and more particularly, to a built-in self test (BIST) method for an audio codec.

2. Description of Related Art

Figure 1:
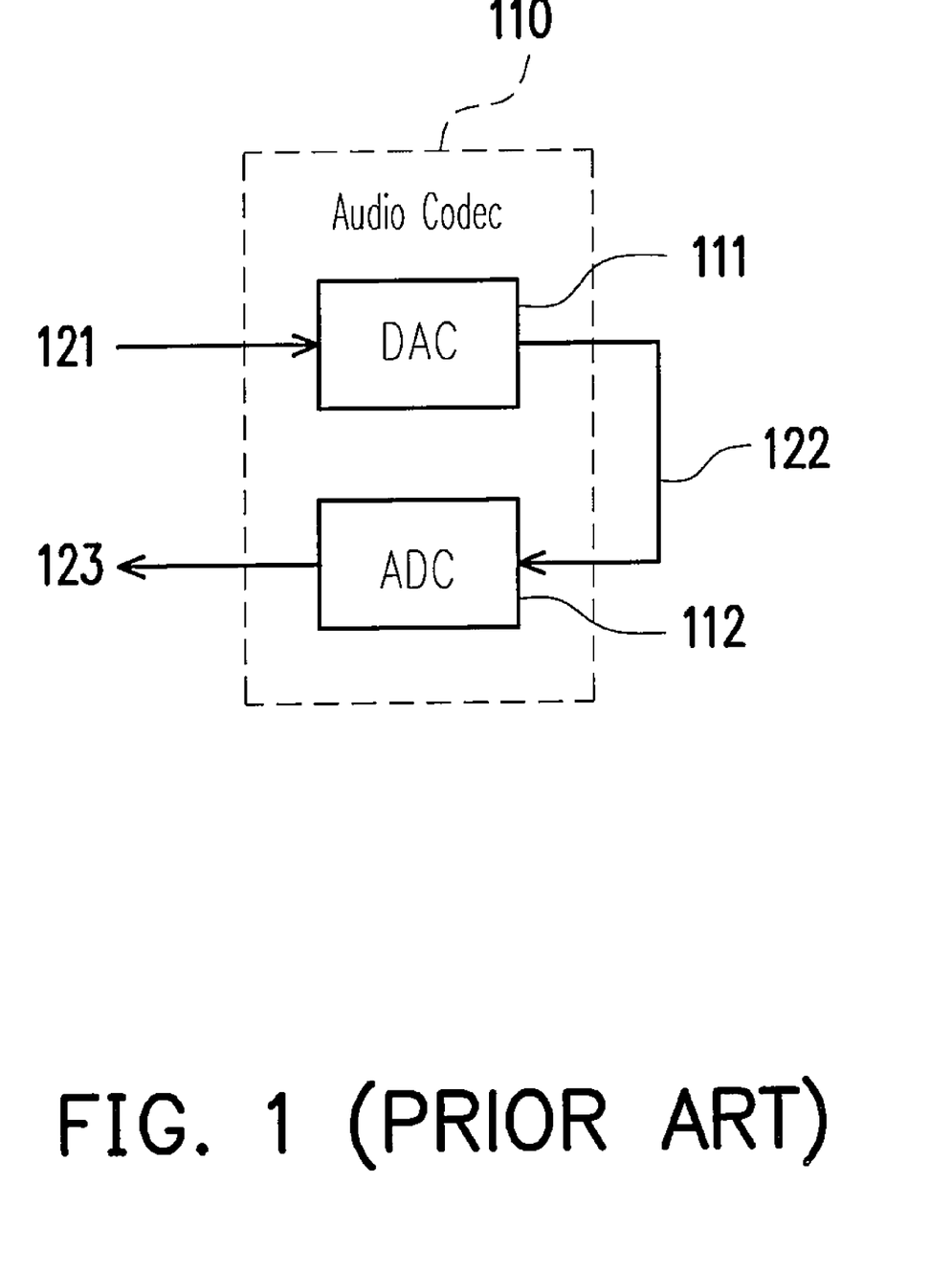
FIGS. 1 through 3 illustrate conventional test methods for an audio codec.

Typically, au audio codec is often employed in an electronic product for processing speech or music, such as a pen recorder, or an MP3 player. Performance of the audio codec must be tested during a mass production. FIG. 1 shows a conventional test method. As shown in FIG. 1, an audio codec 110 includes a digital-to-analog converter (DAC) 111, and an analog-to-digital converter (ADC) 112. A test signal that is a digital sine wave having a frequency of 1 KHz is provided to the DAC 111. The DAC 111 converts the test signal 121 into an analog signal 122. Then, the ADC 112 converts the analog signal 122 into a digital signal 123. Therefore, a signal to noise and distortion ratio (SNDR) analysis is executed to the digital signal 123, and a result can be obtained thereby. Typically, a fast Fourier transform (FFT) is calculated to the digital signal 123, and a spectrum thereof is analysed. Ideally, there would be a spectral component of 1 KHz only. However, when noises of other frequencies are too strong, the audio codec is generally believed as being failed in the quality test.

This method can be used for testing the DAC and the ADC of the codec at the same time. When testing the DAC only, the test signal can be directly inputted to the DAC, and an SNDR analysis can be conducted to the analog signal outputted from the DAC. Likewise, when testing the ADC only, the test signal can be directly inputted to the ADC, and an SNDR analysis can be conducted to the digital signal outputted from the ADC.

Figure 2:
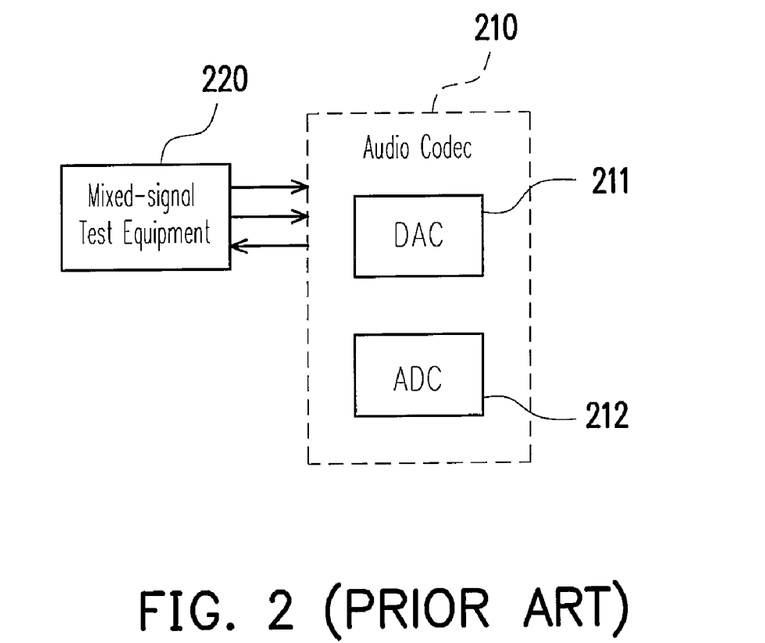
Figure 3:
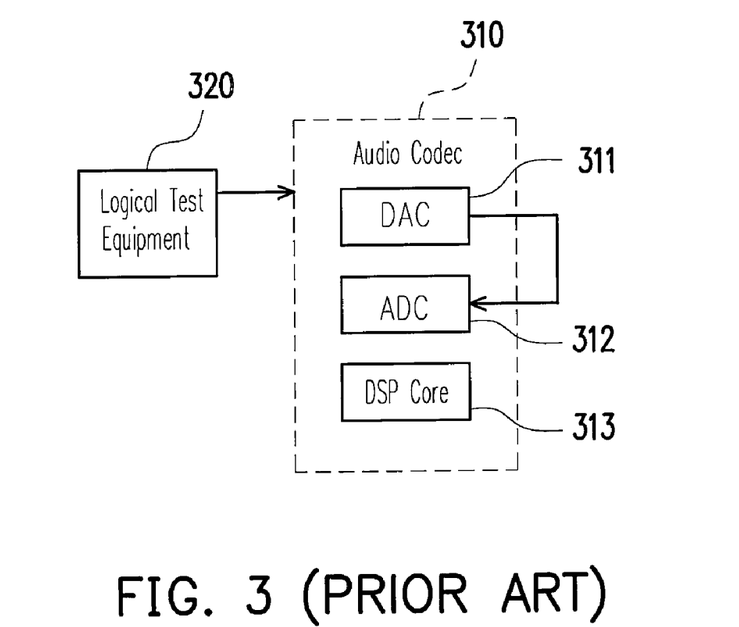

Provision of the test signal and analysis of the test result require additional circuits or equipment, as shown in FIGS. 2 and 3. Referring to FIG. 2, it shows a mixed-signal test equipment 220 for providing a test signal and a clock signal for the test, and conducting an SNDR analysis to the signal fed back from au audio codec 210. Such a mixed-signal test equipment 220 is very expensive, and is capable of providing many types of tests. Unfortunately, it is very expansive and complicated in setting the test environment.

FIG. 3 shows a self test method. Referring to FIG. 3, an audio codec 310 includes a digital signal processor (DSP) core 313. The DSP core 313 provides a test signal and conducts an SNDR analysis to a signal fed back from the DAC 311 or the ADC 312. An external logic test equipment is provided for providing a clock signal for the test. Comparatively, the cost for the DSP core 313 and the logic test equipment 320 is cheaper than the cost for the mixed-signal test equipment 220, and the test environment is convenient to set. However, this self test method is adapted to only a limited amount of tests. Further, a DSP core must be included in a chip of the audio codec, and thus correspondingly increasing the area and the cost of the chip.

SUMMARY OF THE INVENTION

Accordingly, the present invention is directed to a built-in self test (BIST) method adapted for an audio codec. The method is adapted for further simplifying a setting of a test environment, and further saving the testing time and cost.

The present invention is also directed to an audio codec, capable of conducting a self test without a built-in DSP core.

The present invention is further directed to an audio codec, which is obtained by modifying the conventional design so as to be capable of self testing, and more competitive on chip area and cost.

Generally, a FFT function is often built in a conventional test equipment for accelerating the calculation to fast obtain the result. The present invention adopts discrete Fourier transform (DFT) which is mathematically equivalent to the FFT to perform an SNDR analysis, for saving hardware cost.

The present invention provides a BIST method, adapted for an audio codec. The BIST method includes the steps of: a first channel DAC of the audio codec converting a test signal into an analog signal; a first channel ADC of the audio codec converting the analog signal into a digital signal; using a second channel DAC of the audio codec and a second channel ADC of the audio codec to calculate the magnitudes of a plurality of spectral components of a DFT of the digital signal; and determining whether the audio codec passes the test according to the magnitudes of the spectral components.

According to an embodiment of the present invention, when internal random access memories (RAM) of the second channel DAC and the second channel ADC are not enough for storing the spectral components, the second channel DAC and the second channel ADC calculate a first subset of the spectral components and store the first subset in the RAMs of the first channel DAC and the first channel ADC. And then the second channel DAC and the second channel ADC calculate a second subset of the spectral components and store the second subset in the RAMs of the second channel DAC and the second channel ADC.

According to an embodiment of the present invention, the method further includes calculating the magnitude of each of the spectral components for multiple times, so as to calculate an average magnitude of each of the spectral components. Further, the method determines whether the audio codec passes the test or not according to the average magnitudes.

According to another embodiment of the present invention, if the average magnitude of a specific one of the spectral components is larger than or equal to a first threshold and a sum of average magnitudes of the rest of the spectral components is less than a second threshold, it is determined that the audio codec passes the test. The test signal includes a sine wave, and the specific spectral component is the spectral component corresponding to the frequency of the sine wave.

The present invention further provides an audio codec. The audio codec includes a test signal generator, a first channel DAC, a first channel ADC, a second channel DAC, a second channel ADC, a magnitude calculation circuit, and a comparator circuit. The test signal generator is adapted for providing a test signal. The first channel DAC is coupled to the test signal generator for converting the test signal into an analog signal. The first channel ADC is coupled to the first channel DAC, for converting the analog signal into a digital signal. The second channel DAC is coupled to the first channel ADC, for calculating one of the real part and the imaginary part of each of the spectral components of the DFT of the digital signal. The second channel ADC is coupled to the first channel ADC, for calculating another one of the real part and the imaginary part of each of the spectral components of the DFT of the digital signal. The magnitude calculation circuit is coupled to the second channel DAC and the second channel ADC, for calculating a magnitude of each of the spectral components according to the real part and the imaginary part of the spectral component. The comparator circuit is coupled to the magnitude calculation circuit, for determining whether the audio codec passes the test or not according to the magnitudes of the spectral components.

The present invention further provides an audio codec. The audio codec includes a first channel DAC, a first channel ADC, a second channel DAC, and a second channel ADC. The first channel DAC is adapted for converting a test signal into an analog signal. The first channel ADC is coupled to the first channel DAC, for converting the analog signal into a digital signal. The second channel DAC is coupled to the first channel ACD, for calculating one of the real part and the imaginary part of each of the spectral components of a DFT of the digital signal. The second channel ADC is coupled to the first channel ADC, for calculating another one of the real part and the imaginary part of each of the spectral components of the DFT of the digital signal.

The present invention is subject to modifying the conventional audio codec with the hardware thereof by introducing a simple additional circuit for substituting the DSP core to conduct a DFT calculation and analysis, and thus achieving a self test. As such, the present invention does not need expansive external testing equipment, or a built-in DSP core. Therefore the present invention is adapted for conducting a simple, fast, cheap self test during a mass production, and thus saving chip area and cost of the audio codec.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference counting numbers are used in the drawings and the description to refer to the same or like parts.

Currently, there are DACs and ADCs adapted for audio codec provided in the market. Such a DAC or ADC usually includes an arithmetic unit (AU). The present invention utilizes the AUs for conducting the DFT calculation, and utilizes an additional circuit for conducting an analysis to a result of the calculation, so as for replacing a conventional DSP core, and achieving a self test for the audio codec. When testing one channel, e.g., left channel, an AU of another channel, e.g., right channel is demanded for conducting the DFT calculation. As such, the audio codec must contain two or more channels. In illustrating the present invention, the audio codec is exemplified as having two channels. However, it should be noted that the present invention is certainly suitable for audio codec having more than two channels. In the embodiment to be described herebelow, the present invention is illustrated according to an example of testing the left channel, while the right channel is responsible for DFT calculation. In other embodiments of the present invention, the right channel may be tested, while he left channel is responsible for DFT calculation.

Figure 4:
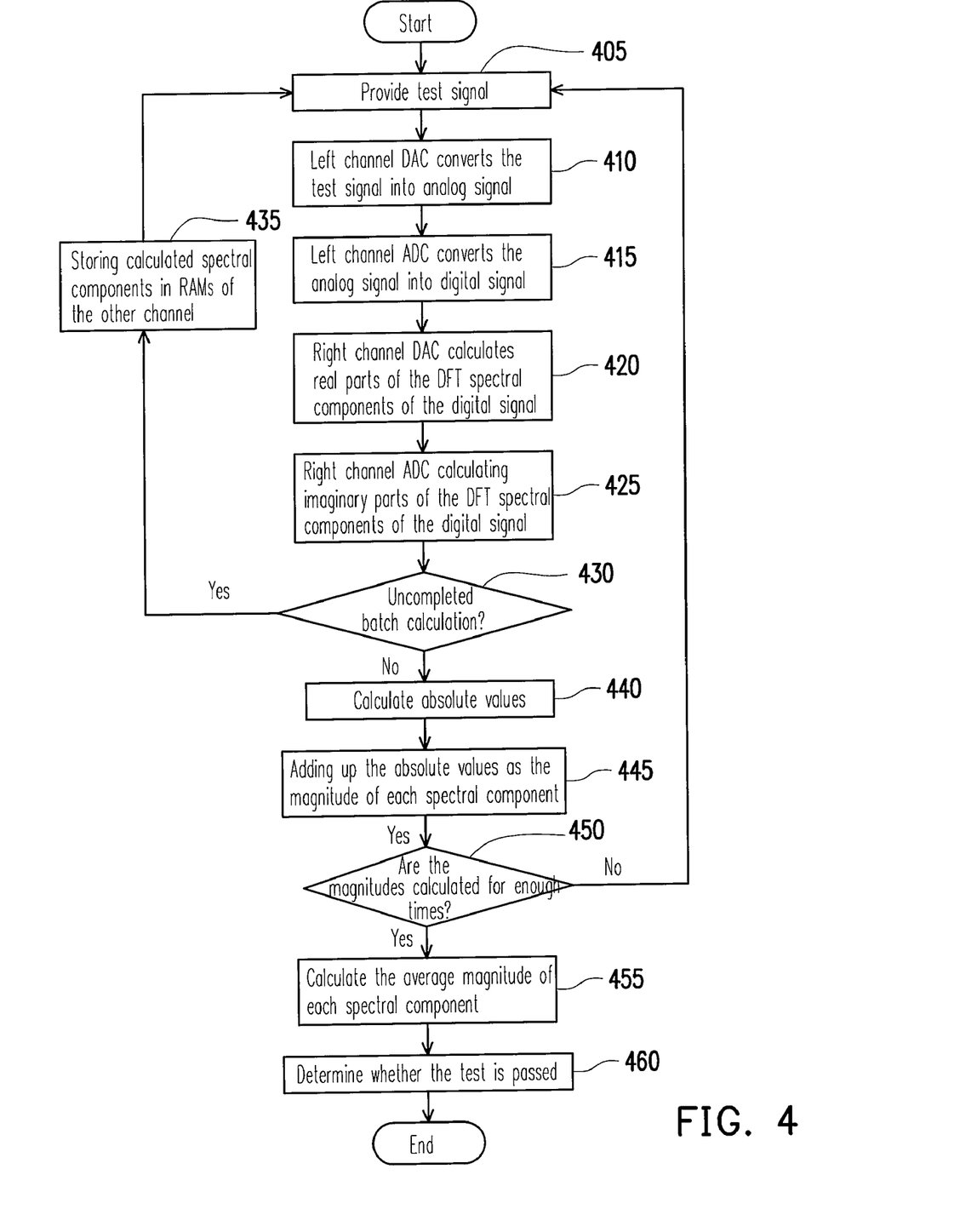
FIG. 4 is a flow chart illustrating a BIST method for an audio codec according to an embodiment of the present invention.
Figure 5:
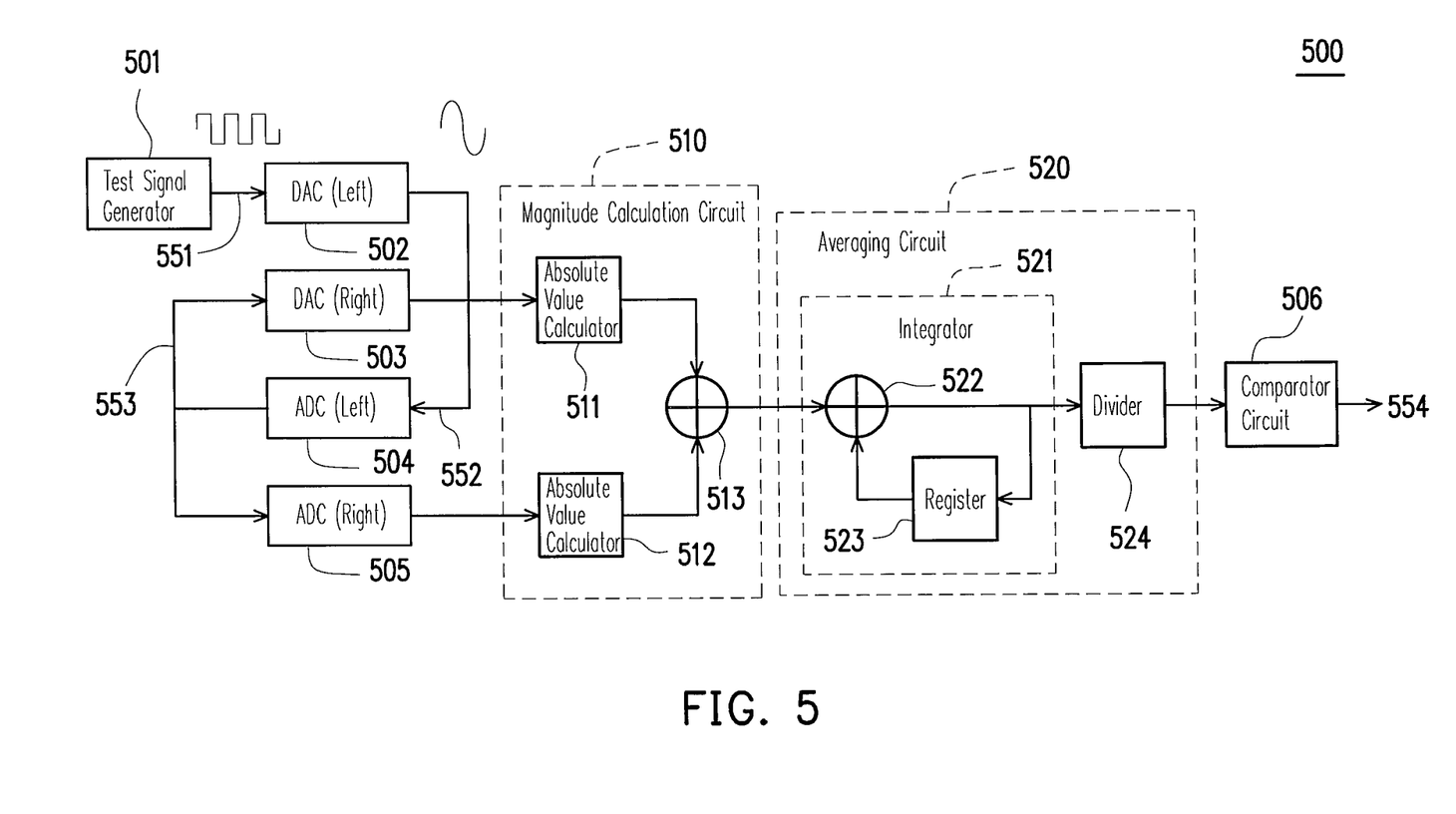
FIG. 5 is a structural diagram illustrating an audio codec according to an embodiment of the present invention.

FIG. 4 is a flow chart illustrating a BIST method for an audio codec according to an embodiment of the present invention. FIG. 5 is a structural diagram illustrating an audio codec according to an embodiment of the present invention. the audio codec 500 includes a test signal generator 501, a left channel digital-to-analog converter (DAC) 502, a left channel analog-to-digital converter (ADC) 504, a right channel DAC 503, a right channel ADC 505, a magnitude calculation circuit 510, an averaging circuit 520, and a comparator circuit 506. The magnitude calculation circuit 510 includes absolute value calculators 511, 512, and an adder 513. The averaging circuit 520 includes an integrator 521, and a divider 524. The integrator 521 includes an adder 522, and a register 523.

The left channel DAC 502 is coupled to the test signal generator 501. The left cannel ADC 504 is coupled to the left channel DAC 502. The right channel DAC 503 is coupled to the left channel ADC 504, and the right channel ADC 505 is also coupled to the left channel ADC 504. The absolute value calculator 511 is coupled to the right channel DAC 503, and the absolute value calculator 512 is coupled to the right channel ADC 505. The adder 513 is coupled to the absolute value calculators 511 and 512. The adder 522 is coupled to the adder 513. The register 523 is coupled to the adder 522. The divider 524 is coupled to the adder 522. The comparator circuit 506 is coupled to the divider 524.

The test signal generator 501 is adapted for providing a test signal 551. The left channel DAC 502 is adapted for converting the test signal 551 into an analog signal 552. The left channel ADC 504 is adapted for converting the analog signal 552 into a digital signal 553. According to an aspect of the embodiment, the right channel DAC 503 is adapted for calculating a real part of a spectral component of a DFT of the digital signal 553, and the right channel ADC 505 is adapted for calculating the imaginary part of the spectral component of the DFT of the digital signal 553. However, according to another aspect of the embodiment, the right channel ADC 505 is alternatively adapted for calculating the real part of the spectral component of the DFT of the digital signal 553, and the right channel DAC 503 is adapted for calculating the imaginary part of the spectral component of the DFT of the digital signal 553. The magnitude calculation circuit 510 is adapted for calculating a magnitude of the spectral component according to the real part and the imaginary part obtained from the above calculations. In the present embodiment, in order to eliminate a random noise, the magnitude of each spectral component is calculated for multiple times, and then calculated by the averaging circuit 520 to obtain an average magnitude of each spectral component. Finally, the comparator circuit 506 determines whether the audio codec passes the test or not according to the average magnitude of each of the spectral components. A result of the determination is outputted in a form of a test result signal 554.

Details of a flow of the BIST method for the audio codec 500 and operation of the audio codec 500 are going to be illustrated below by referring to FIGS. 4 and 5.

The flow of FIG. 4 starts from step 405. First, at step 405, the test signal generator 501 provides the test signal 551. The test signal 551 is a digitally sampled sine wave, which amplitude and frequency can be adjusted by the test signal generator 501. Then at step 410, the left channel DAC 502 converts test signal 551 into the analog signal 552. Then at step 415, the left channel ADC 504 converts the analog signal 552 into the digital signal 553. Therefore, the digital signal 553 outputted from the left channel is to be conducted with the SNDR analysis.

Then at step 420, the right channel DAC 503 calculates the real part of the spectral component of the DFT of the digital signal 553. At step 435, the right channel ADC 505 calculates the imaginary part of the spectral component of the DFT of the digital signal 553. If the digital signal 553 is represented as x[n], a component BIN[k] of the DFT spectrum can be represented as:

$$BIN[k] = \sum_{n=0}^{N-1} X[n] * \exp^{-j\left(\frac{2\pi}{N}*k*n\right)},$$

in which the real part and the imaginary part of the spectral component BIN[k] can be represented as:

$$BIN_R[k] = \sum_{n=0}^{N-1} X[n] * \cos\left(\frac{2\pi}{N}*k*n\right),$$

$$\text{and } BIN_I[k] = \sum_{n=0}^{N-1} X[n] * \sin\left(\frac{2\pi}{N}*k*n\right),$$

respectively, in which $BIN_R[k]$ and $BIN_I[K]$ are the real part and the imaginary part of the spectral component BIN[k] respectively. The present embodiment calculates a 48-point DFT, in which k ranges from 0 to 47. In other embodiments of the present invention, DFTs of other points may be used.

Figure 6:
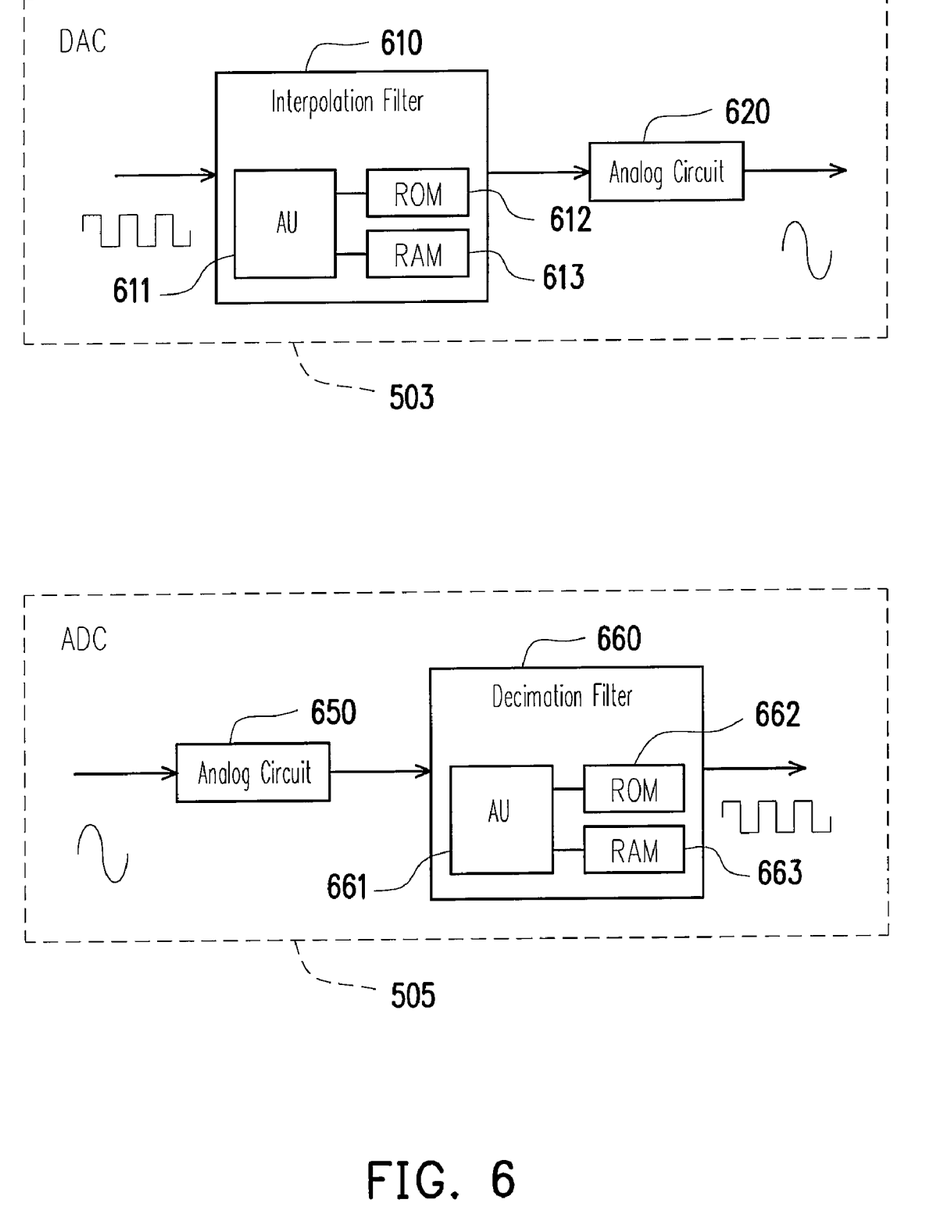
FIG. 6 is a structural diagram illustrating the DAC and the ADC of FIG. 5.

FIG. 6 is a structural diagram illustrating the right channel DAC 503 and the right channel ADC 505. The left channel DAC 502 and the left channel ADC 504 adopt identical structures. The DACs 502, 503, and the ADCs 503, 504 all adopt a delta-sigma structure.

Referring to FIG. 6, the right channel DAC 503 includes an interpolation filter 610, and an analog circuit 620. The interpolation filter 610 includes an arithmetic unit (AU) 611, a read only memory (ROM) 612, and a random access memory (RAM) 613. The AU 611 is adapted for calculating real parts or imaginary parts of the spectral components. In the current embodiment, the AU 611 is responsible for calculating the real parts. The ROM 612 is coupled to the AU 611, for storing a firmware program required by the AU 611 for calculation use. The RAM 613 is also coupled to the AU 611, for storing a result of the calculation, i.e., real parts of the spectral components.

The right channel ADC 505 includes an analog circuit 650, and a decimation filter 660. The decimation filter 660 includes an AU 661, a ROM 662, and a RAM 663. The AU 661 is adapted for calculating real parts or imaginary parts of the spectral components. In the current embodiment, the AU 661 is responsible for calculating the imaginary parts. The ROM 662 is coupled to the AU 661, for storing a firmware program required by the AU 661 for calculation use. The RAM 663 is also coupled to the AU 661, for storing a result of the calculation, i.e., imaginary parts of the spectral components.

Then at step 430, whether the spectral components of DFT should be calculated in different batches is determined, because of the capacity restriction of the RAMs 613 and 663. Conventionally, all spectral components of a DFT should be calculated. However, in the present embodiment, all samples obtained from the digital signal 553 are real numbers, and the DFT spectrum is symmetric, and therefore only a half of the overall spectral components are to be calculated. According to an aspect of the embodiment, the spectral components are previously stored in the RAMs 613 and 663, and outputted in batches after all components are calculated. If the RAMs 613 and 663 have capacities large enough for storing all or a half of the spectral components, the step 430 can be passed over, and the flow of FIG. 4 can be directed directly to step 440. However, when considering the cost, the RAMs 613 and 663 often have capacities not enough for storing all or a half of the spectral components. In this case, the spectral components should be calculated in different batches, and batches of spectral components are stored in RAMs of different channels, and finally outputted together.

Taking the 48-point DFT as an example, the audio codec 500 needs to calculate 24 spectral components, represented as from BIN[0] to BIN[23]. Because the audio codec 500 has two channels, the spectral components BIN[0] to BIN[23] can be divided into two batches for calculating. As discussed in the flow of FIG. 4, first at step 405, the test signal generator 501 transmits the test signal 551 for the first time. Then after the flow from the step 410 to the step 425, the right channel DAC 503 and the right channel ADC 505 calculate the spectral components BIN[0] to BIN[1]. At step 430, because the calculation is being conducted in batches and is not yet completed, the flow is directed to step 435, in which the spectral components BIN[0] to BIN[1] are stored in RAMs of the left channel DAC 502 and the left channel ADC 504.

Then, the flow is directed to the step 405, in which the test signal generator 501 transmits the test signal 551 for the second time. Then after the steps 410 to 425, the right channel DAC 503 and the right channel ADC 505 calculate the spectral components BIN[12] to BIN[23]. Then at step 430, because the calculation in batches and has completed, the spectral components BIN[12] to BIN[23] are stored in RAMs 613 and 663 of the right channel. Then, the spectral components BIN[0] to BIN[23] are outputted in a whole batch to the magnitude calculation circuit 510, and the flow is directed to the step 440.

The calculation in different batches is in fact trading off testing time for memory capacity, in which the spectral components are separately stored in RAMs of different channels, so as to reduce the cost on the memory capacity. In this concern, it would be more efficient in saving the memory capacity when more channels are included in the audio codec.

Then at step 440, the absolute value calculator 511 calculates an absolute value of the real part of each of the foregoing spectral components, and the absolute value calculator 512 calculates an absolute value of the imaginary part of each of the foregoing spectral components. Then at step 445, the adder 513 adds up the absolute values outputted from the absolute value calculators 512 and 513, and outputs the adding result as the magnitude of each spectral component, according to the equation of:

$$BIN_{MAG}[k]=|BIN_R[k]|+|BIN_I[k]|,$$

in which $BIN_{MAG}[k]$ represents the magnitude of the spectral component BIN[k].

The calculation of the magnitude of the spectral component may be interfered by random noises. According to an aspect of the embodiment, in order to depress the random noises, the magnitude of each spectral component is calculated for multiple times and an average magnitude is obtained therefrom, in accordance with the equation:

$$BIN_{\text{AVG\_MAG}}[k] = \frac{1}{M}\sum_{L=0}^{M-1} BIN_{MAG,L}[k],$$

in which $BIN_{AVG\_MAG}[k]$ represents the average magnitude of the spectral component BIN[k], M represents the times for calculating the magnitude (for example M=16), $BIN_{MAG,L}[k]$ represents a magnitude obtained from an $L^{th}$ calculation of the spectral component BIN[k]. At step 450, the flow of FIG. 4 inspects whether the magnitude of each spectral component has been calculated for M times. If it has, then the flow is directed to step 455. Or otherwise, the flow is returned back to repeat steps 405 to 445, to calculate a next magnitude of each of the spectral components.

Then at step 455, the averaging circuit 520 calculates the average magnitude of each of the spectral components according to the foregoing equations. The integrator 521 is a loop constituted by the adder 522 and the register 523, for calculating a summation of M magnitudes of each spectral component, i.e., $$\sum_{L=0}^{M-1} BIN_{MAG,L}[k].$$

The divider 524 divides the summation of the M magnitudes of each spectral component $$\sum_{L=0}^{M-1} BIN_{MAG,L}[k]$$

by M to obtain an average magnitude of each spectral component $BIN_{AVG\_MAG}[k]$. If $M=2^P$, in which P is a predetermined positive integer, the divider 524 is needed to right shift the summation of magnitudes of each spectral component for P bits, instead of conducting a dividing calculation. In such a way, the design for the divider 524 can be simplified and thus shortening the testing time, and saving cost.

Then at step 460, the comparator circuit 506 determines whether the audio codec passes the test according to the average magnitude of each of the spectral components. If the average magnitude of a specific one of the spectral components is larger than or equal to a predetermined first threshold and the sum of average magnitudes of the rest of the spectral components is less than a predetermined second threshold, the comparator circuit 506 determines that the audio codec passes the test. The specific spectral component is the spectral component corresponding to the frequency of the sine wave of the test signal 551. For example, the spectral components BIN[0] to BIN[23] are calculated in the present embodiment, when supposing that the spectral component corresponding to the frequency of the sine wave is BIN[6], a condition for determining whether the test is passed or not is that $BIN_{AVG\_MAG}[6]$ must be larger than or equal to the first threshold value, and a summation of $BIN_{AVG\_MAG}[0]$ to $BIN_{AVG\_MAG}[5]$ and $BIN_{AVG\_MAG}[7]$ to $BIN_{AVG\_MAG}[23]$ must be less than the second threshold value. A signal 554 of the test result indicating whether the test is passed or not is outputted.

If the process of calculating the magnitude of each spectral component would not be interfered by the random noises, the averaging circuit 520 can be saved, and the output of the magnitude calculation circuit 510 is directly provided to the comparator circuit 506. In this case, the condition for determining whether the test is passed or not should be modified to replace $BIN_{AVG\_MAG}[k]$ by $BIN_{MAG}[k]$.

In summary, the present invention utilizes DACs and ADCs of the audio codec to conduct the DFT calculation, and further introduces a simple additional circuit for spectral analysis, so as to achieve a BIST for the audio codec. The present invention does not need a DSP core or expensive external testing equipment, and requires conveniently setting a testing environment, and thus capable of shortening the testing time and cost. The audio codec of the present invention provides a test result signal, and is adapted for mass production. The audio codec of the present invention does not need the DSP core, and thus reducing the chip area and cost, and therefore is very competitive.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in self test (BIST) method, adapted for an audio codec, comprising:
   (a) a first channel digital-to-analog converter (DAC) of the audio codec converting a test signal into an analog signal;
   (b) a first channel analog-to-digital converter (ADC) of the audio codec converting the analog signal into a digital signal;
   (c) using a second channel DAC of the audio codec and a second channel ADC of the audio codec to calculate magnitudes of a plurality of spectral components of a discrete Fourier transform (DFT) of the digital signal; and
   (d) determining whether the audio codec passes the test or not according to the magnitudes of the spectral components.

2. The BIST method according to claim 1, wherein the plurality of spectral components is the overall spectral components of the DFT or a half of the overall spectral components of the DFT.

3. The BIST method according to claim 1, wherein the step (c) further comprises:
   the second channel DAC calculating one of a real part and an imaginary part of each of the spectral components;
   the second channel ADC calculating another one of the real part and the imaginary part of each of the spectral components;
   calculating an absolute value of the real part and an absolute value of the imaginary part of each of the spectral components; and
   calculating the magnitude of each of the spectral components by adding up the absolute value of the real part and the absolute value of the imaginary part of the spectral component.

4. The BIST method according to claim 1, wherein the step (c) further comprises:
   calculating a first subset of the spectral components, and storing the first subset in RAMs of the first channel DAC and the first channel ADC; and
   calculating a second subset of the spectral components, and storing the second subset in RAMs of the second channel DAC and the second channel ADC.

5. The BIST method according to claim 1, further comprising:
   calculating the magnitude of each of the spectral components for multiple times, so as to calculate an average magnitude of each of the spectral components, wherein the step (d) determines whether the audio codec passes the test or not according to the average magnitudes.

6. The BIST method according to claim 5, wherein the magnitude of each of the spectral components is calculated for $2^P$ times, wherein P is a predetermined positive integer, and the step of calculating the average magnitude of each of the spectral components comprises:
   calculating a summation of the $2^P$ magnitudes of the spectral component; and
   right shifting the summation for P bits to obtain the average magnitude of the spectral component.

7. The BIST method according to claim 6, wherein the step (d) comprises:
   if the average magnitude of a specific one of the spectral components is larger than or equal to a first threshold and a sum of the average magnitudes of the rest of the spectral components is less than a second threshold, determining that the audio codec passes the test, wherein the test signal is a sine wave, and the specific spectral component is the spectral component corresponding to a frequency of the sine wave.

8. An audio codec, comprising:
   a test signal generator, adapted for providing a test signal;
   a first channel digital-to-analog converter (DAC), coupled to the test signal generator for converting the test signal into an analog signal;
   a first channel analog-to-digital converter (ADC), coupled to the first channel DAC, for converting the analog signal into a digital signal;
   a second channel DAC, coupled to the first channel ADC, for calculating one of a real part and an imaginary part of each of a plurality of spectral components of a discrete Fourier transform (DFT) of the digital signal;
   a second channel ADC, coupled to the first channel ADC, for calculating another one of the real part and the imaginary part of each of the spectral components of the DFT of the digital signal;
   a magnitude calculation circuit, coupled to the second channel DAC and the second channel ADC, for calculating a magnitude of each of the spectral components according to the real part and the imaginary part of the spectral component; and
   a comparator circuit, coupled to the magnitude calculation circuit, for determining whether the audio codec passes the test or not according to the magnitudes of the spectral components.

9. The audio codec according to claim 8, wherein the plurality of spectral components is the overall spectral components of the DFT or a half of the overall spectral components of the DFT.

10. The audio codec according to claim 8, wherein the second channel DAC comprises:
   a first arithmetic unit (AU), adapted for calculating one of the real part and the imaginary part of each of the spectral components;
   a first read only memory (ROM), coupled to the first AU for storing a first firmware program required by the first AU for calculation use;
   a first random access memory (RAM), coupled to the first AU, for storing the one of the real part and the imaginary part of each of the spectral components; and
   the second channel ADC comprises:
      a second AU, adapted for calculating another one of the real part and the imaginary part of each of the spectral components;
      a second ROM, coupled to the second AU for storing a second firmware program required by the second AU for calculation use; and
      a second RAM, coupled to the second AU, for storing the another one of the real part and the imaginary part of each of the spectral components.

11. The audio codec according to claim 8, wherein the second channel DAC and the second channel ADC calculate a first subset of the spectral components and store the first subset in RAMs of the first channel DAC and the first channel ADC; the second channel DAC and the second channel ADC also calculate a second subset of the spectral components and store the second subset in the RAMs of the second channel DAC and the second channel ADC.

12. The audio codec according to claim 8, wherein the magnitude calculation circuit comprises:
   a first absolute value calculator, coupled to the second channel DAC, for calculating an absolute value of the one of the real part and the imaginary part of each of the spectral components;
   a second absolute value calculator, coupled to the second channel ADC, for calculating an absolute value of the another one of the real part and the imaginary part of each of the spectral components; and
   an adder, coupled to the first absolute value calculator and the second absolute value calculator, for adding up the absolute values outputted from the first absolute value calculator and the second absolute value calculator, and outputting the adding result as the magnitude of each of the spectral components.

13. The audio codec according to claim 8, wherein the second channel DAC and the second channel ADC calculates and outputs the real part and the imaginary part of each of the spectral components for multiple times, and the magnitude calculation circuit calculates the magnitude of each of the spectral components for multiple times, and the audio codec further comprises:
   an averaging circuit, coupled between the magnitude calculation circuit and the comparator circuit, for calculating an average magnitude of each of the spectral components, wherein the comparator circuit determines whether the audio codec passes the test or not according to the average magnitudes.

14. The audio codec according to claim 13, wherein the averaging circuit comprises:
   an integrator, coupled to the magnitude calculation circuit, for calculating a summation of the magnitudes of each of the spectral components; and
   a divider, coupled between the integrator and the comparator circuit, for calculating the average magnitude according to the summation of the magnitudes of each of the spectral components.

15. The audio codec according to claim 14, wherein the magnitude of each of the spectral components is calculated for $2^P$ times, P is a predetermined positive integer, and the divider right shifts the summation for P bits to obtain the average magnitude.

16. The audio codec according to claim 15, wherein if the average magnitude of a specific one of the spectral components is larger than or equal to a first threshold and a sum of the average magnitudes of the rest of the spectral components is less than a second threshold, the comparator circuit determines that the audio codec passes the test, wherein the test signal is a sine wave, and the specific one of the spectral components is the spectral component corresponding to a frequency of the sine wave.

17. An audio codec comprising:
   a first channel digital-to-analog converter (DAC), for converting a test signal into an analog signal;

a first channel analog-to-digital converter (ADC), coupled to the first channel DAC for converting the analog signal into a digital signal;

a second channel DAC, coupled to the first channel ADC, for calculating one of a real part and an imaginary part of each of a plurality of spectral components of a discrete Fourier transform (DFT) of the digital signal; and a second channel ADC, coupled to the first channel ADC, for calculating another one of the real part and the imaginary part of each of the spectral components of the DFT of the digital signal.

18. The audio codec according to claim 17, wherein the plurality of spectral components is the overall spectral components of the DFT or a half of the overall spectral components of the DFT.

19. The audio codec according to claim 17, wherein the second channel DAC comprises:

a first arithmetic unit (AU), adapted for calculating the one of the real part and the imaginary part of each of the spectral components;

a first read only memory (ROM), coupled to the first AU for storing a first firmware program required by the first AU for calculation use;

a first random access memory (RAM), coupled to the first AU, for storing the one of the real part and the imaginary part of each of the spectral components; and the second channel ADC comprises:

a second AU, adapted for calculating the another one of the real part and the imaginary part of each of the spectral components;

a second ROM, coupled to the second AU for storing a second firmware program required by the second AU for calculation use; and a second RAM, coupled to the second AU, for storing the another one of the real part and the imaginary part of each of the spectral components.

20. The audio codec according to claim 17, wherein the second channel DAC and the second channel ADC calculate a first subset of the spectral components and store the first subset in RAMs of the first channel DAC and the first channel ADC; the second channel DAC and the second channel ADC also calculate a second subset of the spectral components and store the second subset in the RAMs of the second channel DAC and the second channel ADC.

* * * * *